(12) United States Patent
Crenshaw et al.

(10) Patent No.: US 6,638,818 B1
(45) Date of Patent: *Oct. 28, 2003

(54) METHOD OF FABRICATING A DYNAMIC RANDOM ACCESS MEMORY WITH INCREASED CAPACITANCE

(75) Inventors: Darius L. Crenshaw, Plano, TX (US); Promod Kumar, Waukegan, IL (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1034 days.

(21) Appl. No.: 08/726,229

(22) Filed: Oct. 4, 1996

Related U.S. Application Data

(60) Provisional application No. 60/004,908, filed on Oct. 6, 1995.

(51) Int. Cl.[7] .................................. H01L 21/8242
(52) U.S. Cl. .................................................. 438/255
(58) Field of Search ......................... 437/47, 52, 60, 437/919; 438/238–244, 253–256, 381, 396–399

(56) References Cited

U.S. PATENT DOCUMENTS

| | | | |
|---|---|---|---|
| 4,146,499 A | 3/1979 | Rosano | 252/166 |
| 5,158,905 A | * 10/1992 | Ahn | |
| 5,209,998 A | 5/1993 | Kavassalis et al. | 430/346 |
| 5,234,807 A | 8/1993 | Texter et al. | 430/526 |
| 5,244,842 A | * 9/1993 | Cathey et al. | 437/228 |
| 5,256,587 A | * 10/1993 | Jun et al. | 437/52 |
| 5,466,626 A | 11/1995 | Armacost et al. | 437/60 |
| 5,554,557 A | * 9/1996 | Koh | |

FOREIGN PATENT DOCUMENTS

| | | | |
|---|---|---|---|
| DE | 4321638 | 6/1993 | ......... H01L/27/108 |
| GB | 2250377 | 3/1992 | ........... H01L/29/92 |
| JP | 1-119049 | * 5/1989 | |

OTHER PUBLICATIONS

Watanabe et al., A new cylindrical capacitor using hemisphereical grained Si (HSG–Si) for 256 Mb DRAM, IEDM 92, pp. 259–262, 1992.*

Vijendra K. Agarwal, "Langmuir–Blodgett Films," *Physics Today*, Jun., 1988, pp. 40–46.

T. Mine, et al., "Capacitance–Enhanced Stacked–Capacitor with Engraved Storage Electrode for Deep Submicron DRAMs," *Extended abstracts of the 21st Conference on Solid State Devices and Materials, Tokyo*, 1989, pp. 137–140.

J. H. Ahn, et al., "Micro Villus Patterning (MVP) Technology for 256Mb DRAM Stack Cell," *1992 Symposium on VLSI Technology Digest of Technical Papers, IEEE*, 1992, pp. 12–13.

Gareth D. Rees, et al., "Microemulsions and Organogels: Properties and Novel Applications," *Advanced Materials*, vol. 5, No. 9, 1993, pp. 608–615.

* cited by examiner

*Primary Examiner*—Jey Tsai
(74) *Attorney, Agent, or Firm*—Frederick J. Telecky, Jr.; W. James Brady, III

(57) ABSTRACT

A method for forming a dynamic random access memory with increased capacitance includes preparing (36) ultra-fine particles in a microemulsion. The particles are deposited (38) on the lower electrode layer of the memory cell. A micro-villus pattern is then formed (40) on the lower electrode layer, using the particles as a mask. A layer of HSG polysilicon may then be deposited (42) on the micro-villus pattern. A dielectric and upper electrode are then formed (44) overlying the lower electrode to form a storage capacitor for the dynamic random access memory.

20 Claims, 3 Drawing Sheets

METHOD OF FABRICATING A DYNAMIC RANDOM ACCESS MEMORY WITH INCREASED CAPACITANCE

This application claims priority under 35 U.S.C. §119(e)(1) of provisional patent application No. 60/004,908, filed Oct. 6, 1995.

TECHNICAL FIELD OF THE INVENTION

This invention relates generally to integrated circuit processing, and more particularly to a method of fabricating a dynamic random access memory with increased capacitance.

BACKGROUND OF THE INVENTION

One of the goals in the design of dynamic random access memory ("DRAM") is to increase the memory capacity on each integrated circuit. To increase the memory capacity, significant efforts have been made at decreasing the size of each of the memory cells that make up the DRAM. One of the most challenging problems faced by DRAM designers is the maintenance of sufficient charge-storage capacity in the capacitors of the memory cells as their area is decreased, particularly as the area is decreased to sub-micron dimensions.

To maintain sufficient charge-storage capacity in stack capacitor type DRAMs, various techniques have been proposed to increase the effective storage-node area beyond the amount allocated within each memory cell. One such technique involves forming a micro-villus pattern on the storage electrode so as to increase its area. With memory cell areas presently used for DRAM cells, the features of the pattern should not exceed approximately 500 Å. Although features with such dimensions can be made with electron-beam lithography techniques, these techniques are too slow for production quantities, and production quantity lithographic tools cannot create such small features.

Ahn et al., in a paper entitled "Micro Villus Patterning (MVP) Technology for 256M6 DRAM Stack Cell," *Symposium on VLSI Technology Digest of Technical Papers*, 1992, p. 12, proposed using a thin layer of hemispherical grain ("HSG") polysilicon (also referred to as rough or rugged polysilicon) as an archipelago mask pattern for creating a micro-villus pattern. The HSG polysilicon was deposited on a thin CVD oxide layer. An oxide etch, followed by a polysilicon etch was used to produce the micro-villus pattern. However, HSG grain size and grain spacing are extremely difficult to control, and thus the micro-villus pattern formed with this technique is not evenly spaced, and thus is not optimized for maximum area.

Mine et al., in a paper entitled "Capacitance-Enhanced Stacked-Capacitor with Engraved Storage Electrode for Deep Submicron DRAMs," *Extended Abstracts of the 21st Conference on Solid State Devices and Materials*, Tokyo, 1989, p. 137, reported the use of small particles as, an etch mask to form a rough pattern on the lower electrode of a stack capacitor. The Mine et al. approach involves mixing small particles of resist in spin-on glass ("SOG"). The mixture is coated on the bottom electrode of a stack DRAM, and the SOG is then selectively etched to leave only the resist particles as a mask on the polysilicon. With this approach, particle size distribution cannot be uniformly controlled, and thus the features of the micro-villus pattern are not optimized. Furthermore, the size of the resist particles is relatively large, on the order of 3,500 Å in diameter, and thus the features of the lower electrode are relatively large, preventing significant increases in lower electrode area.

SUMMARY OF THE INVENTION

Therefore, a need has arisen for a method of fabrication a stack capacitor type DRAM in which a micro-villus pattern is formed on the lower electrode in such a way as to provide significant increases in the area of this electrode. In accordance with the teachings of the present invention, a method of fabricating a micro-villus dynamic random access memory cell is provided which substantially eliminates or reduces disadvantages and problems associated with prior art DRAM memory cells.

In particular, a method of forming a dynamic random access memory cell having a storage capacitor is provided in which a plurality of particles are precipitated in a microemulsion mixture. A lower electrode layer is formed, and the particles are deposited on the lower electrode layer. Using the deposited particles as a mask, a micro-villus pattern is formed on the lower electrode. A dielectric and upper electrode are then formed overlying the lower electrode. In a particular embodiment, the particles are quartz, and are deposited substantially with the Langmuir-Blodgett filming technique.

In another embodiment, a layer of rough polysilicon is formed on the micro-villus pattern so as to further increase the area of the lower electrode.

An important technical advantage of the present invention is the fact that the area of the lower electrode of a stack capacitor type DRAM cell is significantly increased by forming a uniformly distributed micro-villus pattern on the lower electrode. The uniformity of the micro-villus pattern is made possible because a mask is formed with particles prepared through a microemulsion technique. These particles are ultra-fine in size, and can be uniformly distributed, therefore allowing for the evenly distributed micro-villus pattern.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
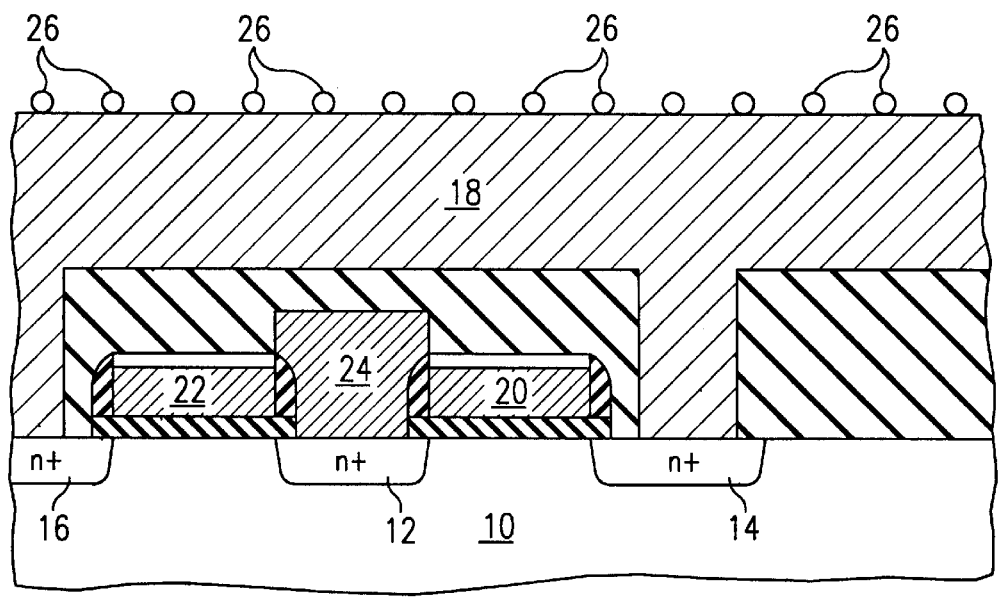
FIG. 1 illustrates a DRAM cell during processing, with an etch mask of fine particles disposed on the lower electrode according to the teachings of the present invention.

FIG. 1 illustrates a side view of a partially formed stack capacitor type DRAM constructed according to the teachings of the present invention. As shown in FIG. 1, a semiconductor substrate 10 is provided. Semiconductor substrate 10 is typically a p-type silicon substrate, although it should be understood that other substrates may be used as well without departing from the intended scope herein.

A doped source region 12 and doped drain regions 14 and 16 are shown in FIG. 1. With a p-type substrate, these source and drain regions are doped with n-type impurities. A lower electrode layer 18 is formed overlying the drain and source regions. The layer 18 will be patterned to form separate lower electrodes (also referred to as the "bottom electrodes" or "storage electrodes") for particular memory cells. The layer 18 is formed of doped polysilicon and conductively coupled to the drain region 14 and source region 16 as shown in FIG. 1. Gates 20 and 22 are formed of doped polysilicon insulatively adjacent channel regions between source 12 and drains 14 and 16, respectively. A bit line 24 is electrically coupled to the source region 12 and insulatively adjacent the gates 20 and 22. The gates 20 and 22 are the control gates of access transistors that couple the bottom electrodes to the bit line 24.

As shown in FIG. 1, particles 26 are deposited overlying the layer 18. These particles are used to form an etch mask, allowing for formation of a micro-villus pattern on the layer 18. The term "micro-villus" is used herein to describe any three-dimensional pattern formed on a bottom electrode through the use of a mask. As will be discussed below, the particles 26 are formed and deposited in a controlled manner. The ability to control their size and distribution allows for formation of an evenly spaced micro-villus pattern, thus optimizing area increase for the pattern. Furthermore, the particles are ultra-fine, for example in the range of 5 to 50 nanometers in diameter, thus allowing for an extremely dense micro-villus pattern, which provides significant area increase. It should be understood, however, that the particles may be smaller or larger without departing from the intended scope of the present invention. As will be discussed below, particles 26 may comprise quartz particles, thus allowing for the use of a single etch process in the formation of the micro-villus pattern.

Figure 2:
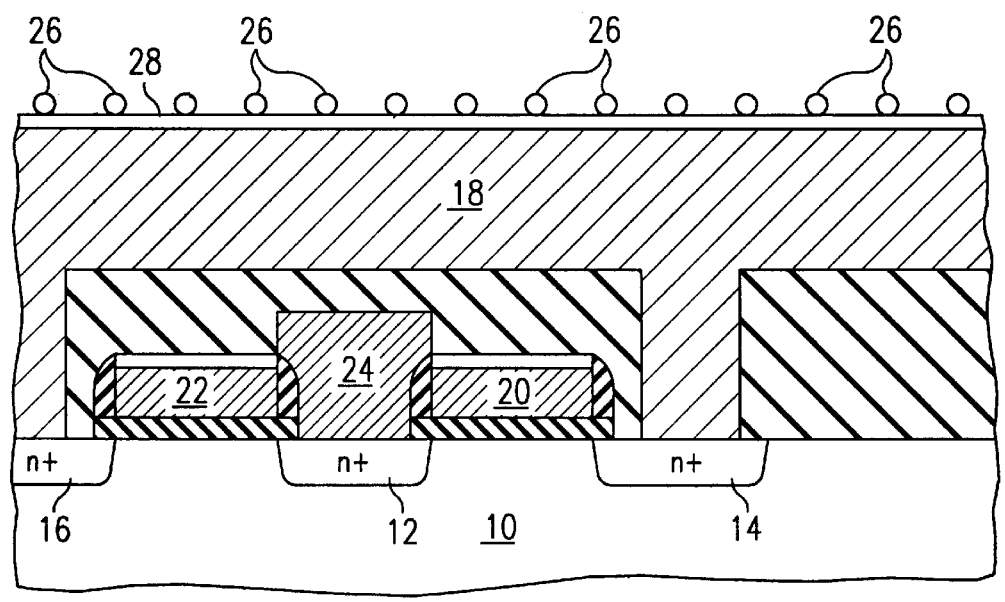
FIG. 2 illustrates another embodiment in which the etch mask of fine particles are deposited on an insulator according to the teachings of the present invention.

FIG. 2 illustrates an alternative embodiment of the present invention, in which the particles 26 are formed overlying a silicon dioxide layer 28. In the example of FIG. 2, the particles 26 comprise silicon.

Examples for the particles 26 have been given as quartz ($SiO_2$) and silicon. However, it should be understood that any material suitable for forming a mask may be used. For example, most any metal or metal oxide, such as $ZnO_2$, may be used, as these will provide an appropriate etch mask.

Figure 3:
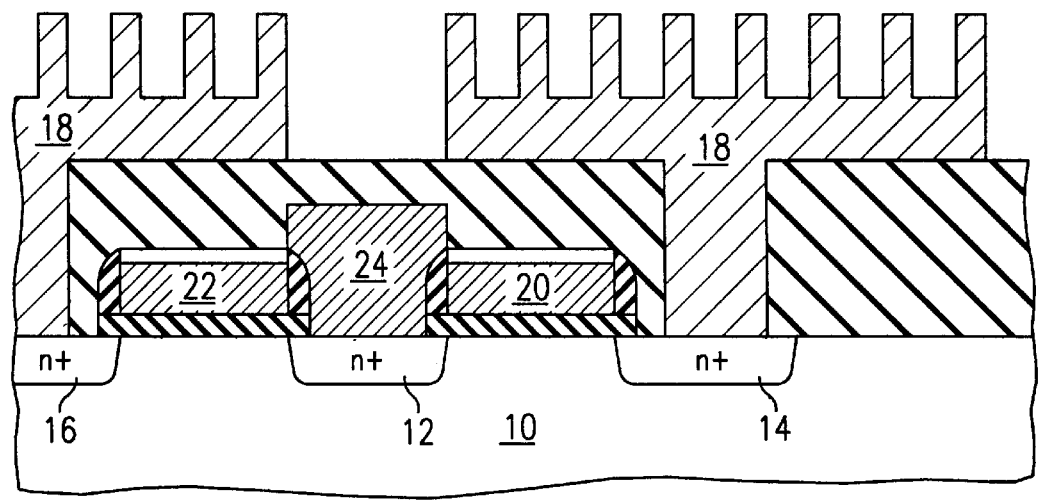
FIG. 3 illustrates a DRAM memory cell during processing, after forming a micro-villus pattern according to the teachings of the present invention.

FIG. 3 illustrates formation of the micro-villus pattern according to the teachings of the present invention. As shown in FIG. 3, the micro-villus pattern is formed by etching the lower electrode layer 18, using the particles 26 as an etch mask. An exemplary depth of the valleys of the villus pattern is 0.25–0.55 micrometers, although other depths may be used. With the hard mask presented by the quartz particles of FIG. 1, a single etch process can be used to form the micro-villus pattern. In particular, a polysilicon etch such as HBr or $SF_6$, which etches the polysilicon electrode layer 18, but not the quartz ($SiO_2$) particles 26, can be used. An etch can then be used to remove the quartz particles, such as a wet buffered HF oxide etch.

With the silicon dioxide layer 28 and the silicon particles of FIG. 2, a two-step etch process is used. In particular, an oxide etch, such as a $CHF_3$ etch, is first used which etches the oxide layer 28, and not the silicon particles. This oxide etch forms a mask of the oxide layer 28. Thus, this layer 28 is referred to as a mask layer. The oxide etch is followed by a polysilicon etch to produce the micro-villus pattern, which also removes the silicon particles. The mask layer can then be removed with an oxide etch.

FIG. 3 also shows separate lower electrodes for each memory cell. These are formed by patterning and etching layer 18. It should be understood that the formation of the separate lower electrodes can occur before or after formation of the micro-villus pattern. For example, the separate lower electrodes can be formed before depositing the particles 26, or after etching the micro-villus pattern. The separate lower electrodes are also referred to as electrode layers.

Figure 4:
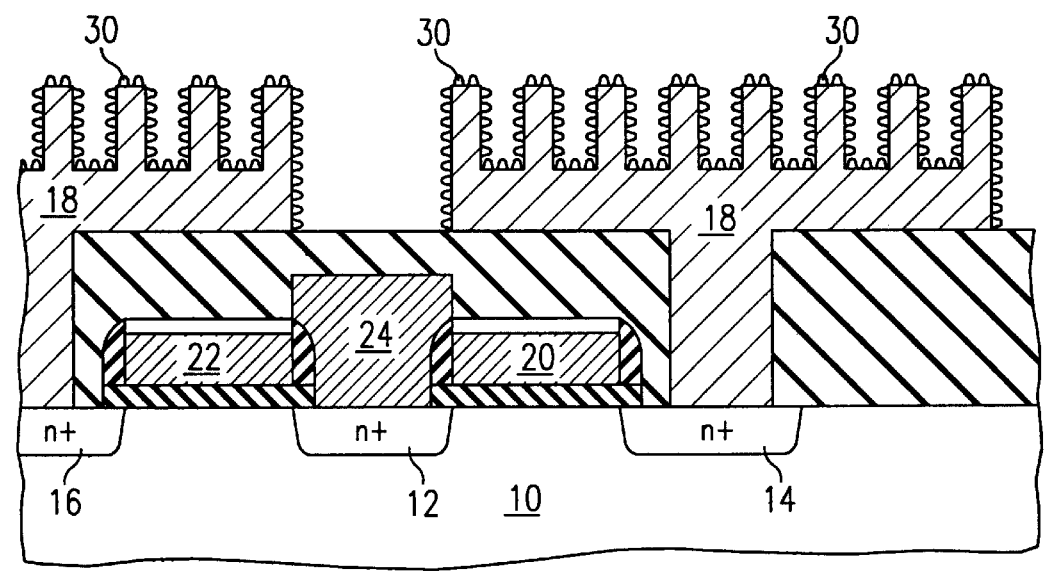
FIG. 4 illustrates deposition of an HSG poly-layer over the micro-villus pattern according to the teachings of the present invention.

FIG. 4 illustrates deposition of an HSG polysilicon layer over the micro-villus topology. This HSG poly layer 30 should be less than approximately 200 Å thick, although thicker layers may also be used without departing from the intended scope herein. This HSG polysilicon layer 30 further increases the surface area of the lower electrode 18 by presenting a rough polysilicon surface on the lower electrode 18. Because the micro-villus pattern is uniformly spaced, it accommodates the HSG polysilicon layer 30.

Figure 5:
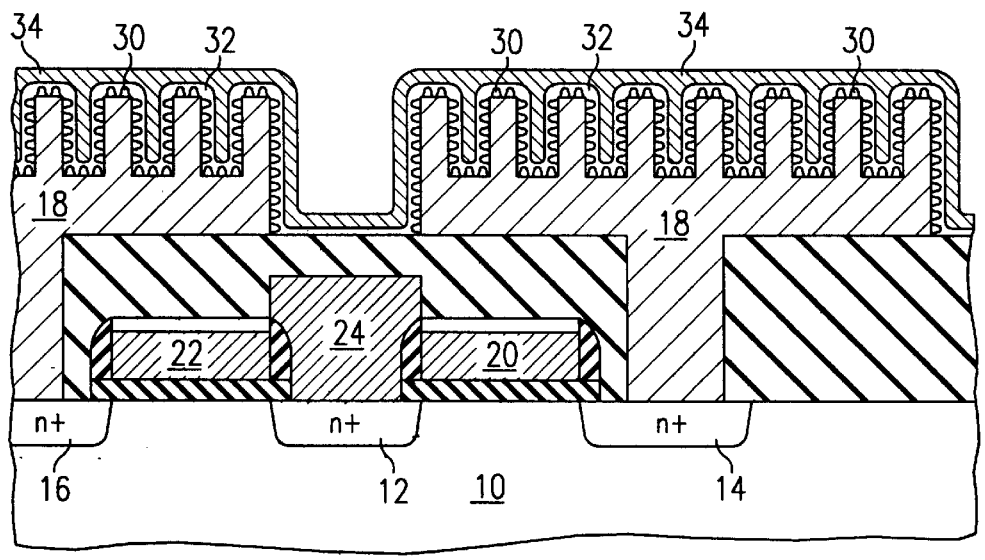
FIG. 5 illustrates formation of a dielectric and upper electrode on the micro-villus pattern of the lower electrode according to the teachings of the present invention.

FIG. 5 illustrates the dielectric 32 and upper electrode 34 of the storage capacitor. The dielectric 32 may be a layer of approximately 45–50 Å of nitride, conformally coated with low pressure chemical vapor deposition ("CVD"). The nitride layer is then oxidized to form a thin oxide layer. The upper electrode 34 is formed of doped polysilicon.

Figure 6:
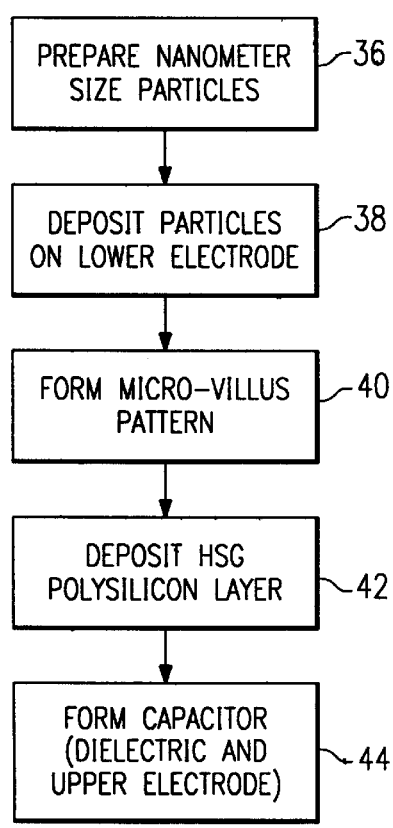
FIG. 6 illustrates a flow diagram for forming the micro-villus pattern according to the teachings of the present invention.

FIG. 6 illustrates a flow diagram of a method of forming a micro-villus DRAM according to the teachings of the present invention. As shown in FIG. 6, nanometer size particles are formed at step 36. These particles should be suitable for forming a mask pattern which will be used to form the micro-villus pattern on the lower electrode. After the particles are formed at step 36, they are deposited on the lower electrode layer at step 38. After depositing the particles on the lower electrode layer at step 38, the micro-villus pattern is formed at step 40. As discussed above, this micro-villus pattern may be formed through various etch processes. Furthermore, as discussed above, separate lower electrodes for each memory cell are formed before or after the formation of the micro-villus pattern.

At step 42, an HSG polysilicon layer may be deposited on the micro-villus topology. Deposition of this HSG polysilicon layer further increases the surface area of the lower electrode, by presenting a rough polysilicon surface. It should be understood, however, that the HSG layer is not required. At step 44, the capacitor for the memory cell is completed by forming a dielectric and upper electrode overlying the lower electrode.

Figure 7:
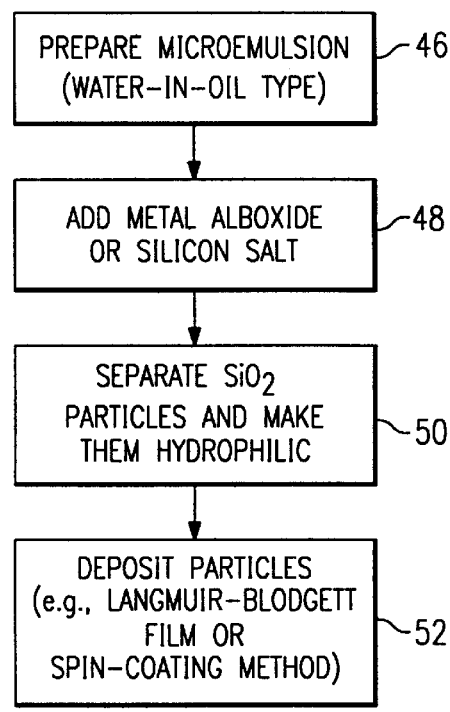
FIG. 7 illustrates a flow diagram for preparing the particles which form the mask pattern according to the teachings of the present invention.

FIG. 7 illustrates a flow diagram for preparing and depositing the particles 26 used to form the mask for forming the micro-villus pattern. As shown in FIG. 7, a microemulsion is prepared at step 46. The microemulsion is formed by adding a suitable surfactant to an oil/water mixture. This results in evenly dispersed "pools" of water throughout the continuous oil phase. The oil may comprise most any oil, such as hexane, octane or pentane. The water part of the water-in-oil microemulsion may be ammonium hydroxide (which is typically approximately 71% $H_2O$). A suitable surfactant which results in the microemulsion is cetyltrimethylammoniumbromide. It should be understood that other surfactants may be used as well without departing from the intended scope herein. Examples include cationic, anionic, and nanionic types.

The formation of microemulsions is discussed generally in "Microemulsions and Organogels: Properties and Novel Applications," Rees et al., *Adv. Mater.* 1993, 5, No. 9, page 608. U.S. Pat. No. 5,209,998, issued May 11, 1993, and entitled "Colored Silica Particles," provides a description of microemulsion techniques and chemicals, and is herein incorporated by reference.

After forming the microemulsion in step 46, a metal alboxide or silicon salt is added to the microemulsion mixture at step 48. Suitable silicon salts include tetraethyl orthosilicate ($Si(OC_2H_5)_4$), $SiCl_4$, $Na_2SiO_3$ or any other Si-salt. By adding the metal alboxide or silicon salt at step 48, quartz particles precipitate within the microemulsions. The size of these particles is typically in the 5 to 50 nanometer range. With the use of tetraethyl orthosilicate, the following precipitation reaction results:

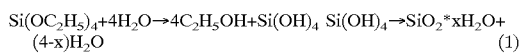

(1)

At step 50, the quartz or silicon particles are separated and made hydrophilic. This is typically performed by centrifuging the microemulsion to remove the oil, and then washing the remainder with a solvent such as chloroform, petroleum ethers, or alcohol, among others.

The individual particles are deposited at step 52 using, for example, a Langmuir-Blodgett film or spin-coating method. Because the nanometer sized particles are hydrophobic in nature, a spreading agent, such as $C_{20}H_5OH$ or stearic acid, is added to the particles to allow them to be dispersed in water, which is one medium for use in depositing the particles on the lower electrode 18. A solvent, such as hexane, is then added to the particles and spreading agent, and the mixture is put on a clean water surface. The solvent evaporates, and the spreading agent results in an even spread of the particles over the air-water interface. Then, the partially formed semiconductor stack is brought through the water, with the particles depositing on the lower electrode.

The deposition of the particles on the lower electrode 18 may be performed by using the Langmuir-Blodgett film technique, as described, for example, in "Langmuir-Blodgett Films," Vijendra K. Agarwal, *Physics Today*, June 1988, page 40, herein incorporated by reference. Alternatively, the particles could be deposited by using a spin coating technique, in which the particles are mixed with spin-on glass ("SOG"). The SOG is then deposited and then selectively removed, leaving only the mask particles on the lower electrode.

The above description provides an example of quartz particle preparation. However, many other particles suitable for forming a mask may be prepared. These include metals and metal oxides, among others. These other particles may also be formed with microemulsion techniques, and deposited as described above.

By forming ultra-fine particles as described in FIG. 7, and then depositing them with a technique such as the Langmuir-Blodgett film coating technique, an ultra-fine mask pattern can be controllably formed on the lower electrode of the stack DRAM memory cell. The ability to control the location and shape of the features of this mask pattern allows for formation of an evenly distributed micro-villus pattern on the lower electrode. By evenly distributing this mask pattern, the effective area of the micro-villus pattern will be maximized.

Although the present invention has been described in detail, it should be understood that various modifications, alterations, and substitutions can be made to this description without departing from the intended scope of the present invention as defined by the appended claims.

What is claimed is:

1. A method of forming a dynamic random access memory cell having a storage capacitor, comprising:
   precipitating a plurality of particles in a microemulsion mixture;
   forming a lower electrode layer;
   depositing the particles in an evenly spaced layer on the lower electrode layer;
   using the deposited particles as a mask to form a micro-villus pattern on the lower electrode layer;
   removing the particles leaving the micro-villus pattern on the lower electrode layer;
   forming a dielectric overlying the micro-villus pattern; and
   forming an upper electrode of the storage capacitor.

2. The method of claim 1, and further comprising forming a layer of rough polysilicon on the micro-villus pattern.

3. The method of claim 1, wherein the particles are quartz.

4. The method of claim 1, wherein the particles are silicon.

5. The method of claim 1, wherein the particles are substantially in the range of 5 to 50 nanometers in diameter.

6. The method of claim 1, wherein the particles are deposited substantially with the Langmuir-Blodgett film technique.

7. The method of claim 1, and further comprising forming an access transistor coupled to the lower electrode layer, the access transistor allowing access to the storage capacitor.

8. A method of forming a dynamic random access memory cell having a storage capacitor, comprising:
   precipitating a plurality of particles in a microemulsion mixture;
   forming a lower electrode layer;
   forming a mask layer overlying the lower electrode layer;
   depositing the particles in an evenly spaced layer on the mask layer;
   using the deposited particles to form a mask of the mask layer;
   using the mask to form a micro-villus pattern on the lower electrode layer;
   removing the particles from the lower electrode layer;
   forming a dielectric overlying the micro-villus pattern; and
   forming an upper electrode of the storage capacitor.

9. The method of claim 8, and further comprising forming a layer of rough polysilicon on the micro-villus pattern.

10. The method of claim 8, wherein the particles are quartz.

11. The method of claim 8, wherein the particles are silicon.

12. The method of claim 8, wherein the particles are deposited substantially with the Langmuir-Blodgett film technique.

13. The method of claim 8, and further comprising forming an access transistor coupled to the lower electrode layer, the access transistor allowing access to the storage capacitor.

14. A method of forming a dynamic random access memory cell having a storage capacitor, comprising:
   precipitating a plurality of particles in a microemulsion mixture;
   separating the particles and making them hydrophilic;
   placing the particles in a water solution;
   evenly spacing the particles;

forming a lower electrode layer;

forming a layer of evenly spaced particles over the lower electrode layer;

forming a micro-villus pattern on the lower electrode layer by etching the lower electrode layer using the layer of evenly spaced particles as a mask;

removing the particles using an etch selective to said particles;

forming a layer of rough polysilicon on the micro-villus pattern;

forming a dielectric overlying the micro-villus pattern; and forming an upper electrode of the storage capacitor.

15. The method of claim 14, wherein said step of forming a layer of evenly spaced particles further comprises the steps of:

depositing the particles on the lower electrode layer; and using the deposited particles as a mask to form the micro-villus pattern.

16. The method of claim 15, wherein the particles are quartz.

17. The method of claim 15, wherein the particles are silicon.

18. The method of claim 15, wherein the particles are deposited substantially with the Langmuir-Blodgett film technique.

19. The method of claim 14, and further comprising forming an access transistor coupled to the lower electrode layer, the access transistor allowing access to the storage capacitor.

20. The method of claim 14, and further comprising:

using the deposited particles to form a mask of the mask layer by selectively etching the mask layer and leaving the particles; and using the mask to form the micro-villus pattern on the lower electrode layer by selectively etching the lower electrode layer, while simultaneously removing the particles.

* * * * *